United States Patent [19]

Shlichta et al.

[11] Patent Number: 4,596,626
[45] Date of Patent: Jun. 24, 1986

[54] METHOD OF MAKING MACROCRYSTALLINE OR SINGLE CRYSTAL SEMICONDUCTOR MATERIAL

[75] Inventors: Paul J. Shlichta, San Pedro, Calif.; R. James Holliday, Siloam Springs, Ark.

[73] Assignee: The United States of America as represented by the United States National Aeronautics and Space Administration, Washington, D.C.

[21] Appl. No.: 465,369

[22] Filed: Feb. 10, 1983

[51] Int. Cl.$^4$ ............................................. C30B 25/20
[52] U.S. Cl. ........................... 156/610; 156/DIG. 88; 156/624
[58] Field of Search ............... 156/DIG. 88, 624, 610; 148/171, 175; 29/576 J, 576 E; 427/87

[56] References Cited

U.S. PATENT DOCUMENTS

| | | | |
|---|---|---|---|
| 3,368,125 | 2/1968 | Pasierb | 148/DIG. 25 |
| 3,370,980 | 2/1968 | Anderson | 156/DIG. 88 |
| 3,959,045 | 5/1976 | Antypas | 156/621 |
| 3,963,538 | 6/1976 | Broadie et al. | 148/175 |
| 4,116,751 | 9/1978 | Zaromb | 156/600 |
| 4,378,259 | 3/1983 | Hasegawa | 148/175 |

FOREIGN PATENT DOCUMENTS 2080619  2/1982  United Kingdom ............. 29/576 E

OTHER PUBLICATIONS

Hovel et al, IBM Technical Disclosure Bulletin, 7/75, pp. 544–555.

Primary Examiner—Hiram H. Bernstein
Attorney, Agent, or Firm—Paul F. McCaul; Thomas H. Jones; John R. Manning

[57] ABSTRACT

A macrocrystalline or single crystal semiconductive material is formed from a primary substrate including a single crystal or several very large crystals of a relatively low-melting material. This primary substrate is deposited on a base such as steel or ceramic, and it may be formed from such metals as zinc, cadmium, germanium, aluminum, tin, lead, copper, brass, magnesium silicide, or magnesium stannide. These materials generally have a melting point below about 1000° C. and form on the base crystals the size of fingernails or greater. The primary substrate has an epitaxial relationship with a subsequently applied layer of material, and because of this epitaxial relationship, the material deposited on the primary substrate will have essentially the same crystal size as the crystals in the primary substrate. If required, successive layers are formed, each of a material which has an epitaxial relationship with the previously deposited layer, until a layer is formed which has an epitaxial relationship with the semiconductive material. This layer is referred to as the epitaxial substrate, and its crystals serve as sites for the growth of large crystals of semiconductive material. The primary substrate is passivated to remove or otherwise convert it into a stable or nonreactive state prior to deposition of the semiconductive material.

19 Claims, No Drawings

METHOD OF MAKING MACROCRYSTALLINE OR SINGLE CRYSTAL SEMICONDUCTOR MATERIAL

BACKGROUND OF THE INVENTION

1. Field of the Invention

The invention described herein was made in the performance of work under a NASA Contract and is subject to the provisions of Section 305 of the National Aeronautics and Space Act of 1958, Public Law 85-568 (72 STAT 435; 43 USC 2457).

This invention relates to a method for making macrocrystalline or single crystal semiconductive material, and particularly relates to a method in which a substrate comprising macrocrystals or a single crystal is formed on a base and then the semiconductive material, or other macrocrystalline material of interest, such as an optical wave guide, is deposited epitaxially on this substrate.

2. Background Discussion

Photovoltaic cells, such as solar cells, convert sunlight into electrical energy in a nonpolluting, environmentally benign manner. Such cells, however, are not utilized on a large scale because they are costly. The principal reason for the high cost of such cells is that the crystalline semiconductive material, which is the principal component of these cells, is expensive to manufacture. This crystalline material is made, for example, of doped silicon, gallium arsenide, and other semiconductive materials, and is formed in layers or wafers. These wafers are composed of a single crystal or a macrocrystalline aggregate. The current methods for producing such single crystal or macrocrystalline semiconductive materials are expensive because of the complexity of the processes and equipment employed to make such material.

The well-known phenomenon of epitaxy is used to produce large crystals of semiconductive materials. Epitaxy is the phenomenon where the crystal lattice dimensions and orientation of one substance causes a second substance deposited thereon to grow similar size crystals of similar orientation from the surface of the first substance. The chemical composition and crystal structure of the second substance may be the same as or different from that of the first substance. Epitaxial crystal growth may be accomplished by a variety of processes including chemical vapor deposition, electrolytic reaction, or other techniques. The phenomenon of epitaxy is known for many substance pairs, such as gallium arsenide on germanium, gallium arsenide on zinc selenide, silicon on sapphire, and others. Scientists have also predicted epitaxial relationships for numerous pairs of substances which have similarity in crystal lattice dimensions.

Although the use of epitaxy as a means of producing films of semiconductive material is widespread in the electronics industry, it is not completely satisfactory. The chief drawback of this technique is that the substrates of the desired epitaxial material are often nearly as difficult to grow as the semiconductive material. The present invention extends the range of useable epitaxial substrates to low-melting materials hitherto regarded as unusable.

SUMMARY OF THE INVENTION

We have now invented a method for making macrocrystalline or single crystal semiconductive material starting with relatively low melting, but easily crystallized materials, which can be formed on a suitable base into a layer of macrocrystals or a single crystal. This layer serves as a primary substrate for a secondary epitaxial substrate on which macrocrystals or a single crystal of semiconductive material can be deposited. Typically, the material comprising the primary substrate has a melting point below about 1000° C. Examples of such materials are zinc, cadmium, germanium, aluminum, tin, lead, copper, brass, magnesium silicide, or magnesium stannide. Inorganic salts can also be used.

Although the materials used in this invention do not have an epitaxial relationship with the base, they will, under the proper conditions, form large crystals. These metals usually do not have an epitaxial relationship with the semiconductive material. Consequently, one or more mutually epitaxial layers are applied as intermediate layers prior to the formation of the semiconductive layer.

The base supports the primary substrate which adheres to its surface. The thickness of the primary substrate usually ranges from about $10^{-6}$ inch to about $10^{-2}$ inch. Suitable bases are metal, ceramic, plastic, or glass sheets having thicknesses from about $10^{-3}$ inch to about $10^{-1}$ inch. Potentially usable base materials, depending on the nature and application of the ultimate semiconductive device, include steel sheet, glass plate, plastic film, and aluminum foil.

The primary substrate may be applied to the base in many different ways. One way is to dip the base into a molten pool of the metal, withdrawing the base from the molten pool, and allowing the thin film of liquid clinging to the surface of the substrate to cool slowly and solidify. Many metals will, upon solidification, form large crystals of the size desired. One example of this approach is employing conventional galvanizing techniques to coat a steel sheet with zinc. If the temperature of the molten pool and rate at which the steel sheet is pulled from the molten pool are carefully controlled, the primary substrate will comprise bands or strips of parallel zinc crystals. The width of these bands will be a few millimeters or greater. The length of the band will be as long as the length of the base.

Another way to form the primary substrate is to vaporize the metal and allow the vapor to condense on the surface of the base. Normally crystals formed by condensation are not sufficiently large. To increase the crystal size, the solid metallic layer is remelted by sweeping a hot zone slowly across the surface of the metallic layer. This zone melting will result in the formation of large crystals of the desired size. In accordance with conventional practice, the melt zone is curved. For example, aluminum may be deposited on a ceramic base from a vapor phase. The aluminum layer is then scanned with a laser beam which instantaneously melts a zone of the aluminum as the beam scans the surface of the aluminum layer. These zones are generally a few millimeters thick in the direction of travel and as wide as the material to be processed. The resolidification of these zones of molten aluminum promotes the growth of single or large crystals.

In some cases, the base may be grown on the primary substrate prior to recrystallization of the latter. Thus, if a primary substrate of aluminum crystals is desired, one may start by anodizing one side of a sheet of aluminum foil to form a thin aluminum oxide base. The foil may then be zone melted to form a primary substrate of macroscopic crystals of aluminum on the aluminum oxide base.

The terms "macrocrystals" or "single crystal" mean crystal films composed of crystals whose dimensions along the plane of the film are much greater than the thickness of the film. For example, they may be a single crystal suitable for use in a single device, and typically have a planar dimension equal to 1000 times or more greater than its thickness, and typically are the size of fingernails.

As mentioned above, usually one or more intermediate layers are formed on or from the primary substrate until a layer is provided which has an epitaxial relationship with the desired semiconductive material. This intermediate layer is referred to as the epitaxial substrate. Upon depositing the semiconductive material on the epitaxial substrate, crystals of semiconductive material form which have essentially the same planar dimensions as the crystals in the epitaxial substrate. The epitaxial substrate generally has a thickness ranging from about $10^{-6}$ inch to about $10^{-3}$ inch, and the layer of semiconductive material has a thickness commensurate with the device desired, for example, from 1 micron to about 100 microns.

As a general rule, the primary substrate is made of a material which is too low melting or is too chemically reactive to serve as a suitable substrate for the semiconductive material. Consequently the primary substrate must be passivated prior to deposition of the semiconductive material. The reason for this is because the primary substrate is usually made of a low melting material which will melt at the temperatures at which the semiconductive material is being deposited. Consequently, the presence of the primary substrate may interfere with the deposition of the semiconductive material.

Passivation may be accomplished by, for example, eliminating the primary substrate or stabilizing it. The primary substrate may be eliminated in several ways. For example, it may be removed by reaction with another substance to form the secondary epitaxial substrate. Or, the metal of the primary substrate may react with the base. For example, zinc will at elevated temperatures react with iron in a steel base to form the high-melting alloy $ZnFe_{12}$. Another approach is to deposit a new or replacement base on top of the epitaxial substrate and then dissolve or strip off the original base and primary substrate. The surface of the epitaxial substrate which was adhering to the primary substrate is now exposed, and the semiconductive material is applied to this newly exposed surface.

It may be necessary to form several intermediate layers until there is provided a layer composed of a material which has an epitaxial relationship with the desired semiconductive material. For example, there is an epitaxial relationship between zinc selenide and zinc sulfide and between gallium arsenide and zinc selenide. Since it is easy to form large crystals of zinc on sheets of steel, a typical galvanized steel sheet may be used as a starting material. The zinc layer is exposed to a sulfidizing atmosphere to react with the zinc to produce a zinc sulfide layer in which the zinc sulfide crystals have essentially the same large planar dimensions as the zinc. The step of forming the zinc sulfide may also eliminate the zinc primary substrate. Zinc selenide crystals will grow epitaxially from the surface of the zinc sulfide layer as zinc selenide is deposited thereon by chemical vapor deposition techniques. Likewise, gallium arsenide crystals will grow epitaxially from the surface of the zinc selenide layer as gallium arsenide is deposited thereon by conventional vapor deposition techniques.

The following sequences of materials are either known to exhibit epitaxy or are predicted to exhibit epitaxy: (1) aluminum, aluminum oxide (sapphire), and silicon; (2) zinc, zinc sulfide, zinc selenide, and gallium arsenide; (3) zinc, zinc sulfide, and silicon; (4) cadmium and cadmium sulfide; and (6) cadmium, cadmium telluride, and mercury cadmium telluride. The epitaxial substrate and semiconductive layer may be made from these or other pairs of materials which exhibit epitaxy.

The following table presents examples of pairing semiconductive materials according to this invention.

TABLE

| | Step 1 A | Step 1 B | Step 2 | Step 3 | Step 4 |
|---|---|---|---|---|---|
| Example I | hot dipping of zinc in steel of other base material | | treatment with $H_2S$ to form ZnS layer (OR) electrolytic reaction with alkali sulfide solution to form ZnS | heating to react zinc with iron base to form Fe—Zn alloy (OR) continued $H_2S$ reaction until zinc is depleted | vapor phase deposition silicon (e.g. via $SiI_4$) |
| Example II | same as Example I | | A. same as Example I B. deposition of ZnSe on ZnS layer | same as Example I | vapor phase deposition of gallium arsenide |
| Example III | hot dipping of cadmium on metal or ceramic base | | Treatment with $H_2S$ to form CdS layer (OR) electrolytic reaction as in Example I above | application of replacement base and removal of original base and remaining Cd (OR) continued $H_2S$ reaction until cadmium is depleted | continued deposition of cadmium sulfide layer |
| Example IV | same as Example III | | Treatment with $H_2Te$ to form CdTe layer | same as Example III | liquid- or vapor-phase deposition of mercury cadmium telluride |
| Example V | anodizing of one side of aluminum foil to form $Al_2O_3$ base | zone melting of aluminum layer to form single crystal substrate | heating in oxygen to form single crystal layer of sapphire | continued heating in oxygen to deplete aluminum layer | deposition of silicon as per silicon-on-sapphire technology |
| Example VI | deposition of very thin (100 Å) aluminum on glass or mullite plate | laser beam zone melting of aluminum | same as Example V | same as Example V (OR) remove base, with or without use of replace- | same as Example V |

TABLE-continued

| | Step 1 | | | | |
|---|---|---|---|---|---|
| A | B | Step 2 | Step 3 | Step 4 | |
| | | | | ment base | |

NOTE:
The epitaxial nature of the oxidation or sulfide reactions used in the examples of Step 2 have all been reported in the literature.

The above description and examples present the best mode contemplated of carrying out the present invention. This invention is, however, susceptible to modifications and alternate constructions from the embodiments discussed above. It is not the intention to limit the invention to the particular embodiments disclosed; but on the contrary, the invention is to cover all modifications, equivalencies, and alternative constructions falling within the spirit and scope of the invention as expressed in the appended claims.

What is claimed is:

1. A method of making macrocrystalline or single crystal semiconductive material comprising the steps of:
   (a) depositing on the surface of a base a low melting material having a nonepitaxial relationship with the base with said low melting material having a crystalline form which is not macrocrystalline or a single crystal but which is capable of transformation to a macrocrystalline or single crystal form when treated under selected conditions:
   (b) treating said low melting material under selected conditions to transform its crystalline form and to produce a primary substrate having a macrocrystalline or single crystal form, with the said treating being carried out either during or after the deposit of the low melting material on the base;
   (c) forming on or from the primary substrate an epitaxial substrate in the form of macrocrystals or a single crystal having planar dimensions substantially the same as the planar dimensions of said macrocrystals or single crystal in the primary substrate layer,
   (d) passivating the primary substrate prior to step (c), and
   (e) depositing on the surface of the epitaxial substrate a semiconductive material which has an epitaxial relationship with the material comprising the epitaxial substrate to form macrocrystals or a single crystal which have planar dimensions substantially the same as the planar dimensions of the macrocrystals or single crystal in the epitaxial substrate.

2. The method of claim 1 wherein the material of the primary substrate has a melting point below about 1000° C.

3. The method of claim 2 wherein the material of the primary substrate is zinc, cadmium, germanium, aluminum, tin, lead, copper, brass, magnesium silicide, or magnesium stannide.

4. The method of claim 1 wherein the base is iron or an alloy of iron.

5. The method of claim 1 wherein the base is a ceramic.

6. The method of claim 1 wherein the base is formed on the primary substrate which is then recrystallized to form large crystals.

7. The method of claim 1 wherein the primary substrate is formed by applying the low melting material to the base as a molten liquid which covers the base as a thin film and then solidifies.

8. The method of claim 7 wherein the primary substrate is formed by passing the base through molten metal and withdrawing the substrate from the molten metal at a controlled rate such that it cools slowly to solidify into a single crystal or macrocrystals.

9. The method of claim 8 wherein the crystals formed are generally parallel and adjacent elongated bands.

10. The method of claim 1 wherein the epitaxial substrate is formed by gas phase deposition.

11. The method of claim 1 wherein the epitaxial substrate is formed by electrolytic deposition or reaction.

12. The method of claim 1 wherein the epitaxial substrate is aluminum oxide (sapphire), and the semiconductive material is silicon.

13. The method of claim 1 wherein the epitaxial substrate is zinc selenide and the semiconductive material is gallium arsenide.

14. The method of claim 1 wherein the epitaxial substrate is zinc sulfide and the semiconductive material is silicon.

15. The method of claim 1 wherein the epitaxial substrate is cadmium and the semiconductive material is cadmium sulfide.

16. The method of claim 1 wherein the epitaxial substrate is cadmium and the semiconductive material is cadmium telluride.

17. The method of claim 1 wherein there is deposited a replacement base on the epitaxial layer and wherein the primary substrate is then removed to expose the surface of the epitaxial substrate adhering to the primary substrate.

18. The method of claim 1 wherein a plurality of successive epitaxial substrates are formed until there is provided an epitaxial substrate of a material which has an epitaxial relationship with a semiconductive material of the desired composition.

19. The method of claim 18 wherein (a) the base is steel and the primary substrate comprises zinc, (b) an intermediate epitaxial substrate of zinc selenide is formed, and (c) a semiconductive layer of gallium arsenide is formed on the zinc selenide layer.

* * * * *